(12) United States Patent
Peng

(10) Patent No.: US 12,133,426 B2
(45) Date of Patent: Oct. 29, 2024

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Simin Peng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/753,131

(22) PCT Filed: Feb. 11, 2022

(86) PCT No.: PCT/CN2022/075966
§ 371 (c)(1),
(2) Date: Feb. 21, 2022

(87) PCT Pub. No.: WO2023/142169
PCT Pub. Date: Aug. 3, 2023

(65) Prior Publication Data
US 2024/0040858 A1 Feb. 1, 2024

(30) Foreign Application Priority Data
Jan. 25, 2022 (CN) .......................... 202210088445.4

(51) Int. Cl.
*H10K 59/124* (2023.01)
*H10K 59/12* (2023.01)
*H10K 59/80* (2023.01)

(52) U.S. Cl.
CPC ....... *H10K 59/124* (2023.02); *H10K 59/1201* (2023.02); *H10K 59/8731* (2023.02)

(58) Field of Classification Search
CPC ............. H10K 59/124; H10K 59/1201; H10K 59/8731; H10K 59/122; H10K 50/11;
(Continued)

(56) References Cited

U.S. PATENT DOCUMENTS 10,868,102 B1 * 12/2020 Zhang .................... H01L 23/562
2017/0148856 A1    5/2017 Choi et al.
(Continued)

FOREIGN PATENT DOCUMENTS

CN    103811530 A    5/2014
CN    106887523 A    6/2017
(Continued)

OTHER PUBLICATIONS

Chinese Office Action issued in corresponding Chinese Patent Application No. 202210088445.4 dated Sep. 22, 2022, pp. 1-8.
(Continued)

*Primary Examiner* — J. E. Schoenholtz
*Assistant Examiner* — Joe Schoenholtz

(57) ABSTRACT

Embodiments of the present application disclose a display panel and a display device. The display panel provided by the embodiments of the present application includes a substrate, an inorganic structure layer, a retaining wall structure, and a light-emitting layer. The inorganic structural layer is disposed on the substrate. The inorganic structure layer is provided with a groove. The retaining wall structure is arranged on the inorganic structure layer. The light-emitting layer is arranged on the retaining wall and the inorganic structure layer, wherein at least one side of the retaining wall structure covers a part of an opening of the groove. The light-emitting layer is disconnected at the groove.

20 Claims, 7 Drawing Sheets

(58) Field of Classification Search
CPC .. H10K 50/84; H10K 50/844; H10K 59/1213; Y02E 10/549
See application file for complete search history.

(56) References Cited

U.S. PATENT DOCUMENTS

| | | | |
|---|---|---|---|
| 2018/0151832 A1 | 5/2018 | Lee et al. | |
| 2019/0214587 A1 | 7/2019 | Kim | |
| 2019/0214600 A1 | 7/2019 | Park et al. | |
| 2020/0176520 A1 | 6/2020 | Kim et al. | |
| 2020/0365825 A1 | 11/2020 | Yu | |
| 2021/0408147 A1 | 12/2021 | Sun | |
| 2023/0016921 A1* | 1/2023 | Jiang | H01L 23/562 |
| 2023/0422546 A1* | 12/2023 | Luo | H10K 71/80 |
| 2024/0188391 A1* | 6/2024 | Zhang | H10K 59/122 |

FOREIGN PATENT DOCUMENTS

| | | |
|---|---|---|
| CN | 107452894 A | 12/2017 |
| CN | 109671870 A | 4/2019 |
| CN | 109786427 A | 5/2019 |
| CN | 109801956 A | 5/2019 |
| CN | 110112317 A | 8/2019 |
| CN | 110224006 A | 9/2019 |
| CN | 110416435 A | 11/2019 |
| CN | 110429118 A | 11/2019 |
| CN | 110634928 A | 12/2019 |
| CN | 110858630 A | 3/2020 |
| CN | 110867475 A | 3/2020 |
| CN | 111403621 A | 7/2020 |
| CN | 111430566 A | 7/2020 |
| CN | 111755484 A | 10/2020 |
| CN | 111933822 A | 11/2020 |
| CN | 112420954 A | 2/2021 |
| CN | 112531003 A | 3/2021 |
| CN | 112952017 A | 6/2021 |
| CN | 113066839 A | 7/2021 |
| CN | 113270462 A | 8/2021 |
| CN | 113314567 A | 8/2021 |
| CN | 113690251 A | 11/2021 |
| JP | 2016039029 A | 3/2016 |
| KR | 20200026381 A | 3/2020 |
| KR | 20210083709 A | 7/2021 |

OTHER PUBLICATIONS

International Search Report in International application No. PCT/CN2022/075966, mailed on Jun. 27, 2022.
Written Opinion of the International Search Authority in International application No. PCT/CN2022/075966, mailed on Jun. 27, 2022.
Korean Office Action issued in corresponding Korean Patent Application No. 10-2022-7010596 dated Sep. 22, 2023, pp. 1-6.
Japanese Office Action issued in corresponding Japanese Patent Application No. 特願 2022-520941 dated Mar. 19, 2024, pp. 1-5.

* cited by examiner

DISPLAY PANEL AND DISPLAY DEVICE

BACKGROUND OF INVENTION

Field of Invention

The present application relates to the field of display technology, and in particular, to a display panel and a display device.

Description of Prior Art

Flexible organic light-emitting semiconductor (OLED) displays have the characteristics of low power consumption and bendability, which have a profound impact on the application of wearable devices. Plastic is used to replace glass to manufacture the display to make the display more durable and lighter. The flexible OLED display with excellent performance will be widely used with the continuous penetration of personal smart terminals.

A shadow effect will be generated by organic electroluminescence (EL) materials at an edge of an opening of a mask during an evaporation process. Although the mask design is optimized, the shadow effect cannot be completely eliminated. Therefore, when designing the panel, it is necessary to consider the shadow situation during a coating process of each EL material, resulting in a greatly increased panel border. In order to enhance the user's experience, the border of a product is continuously compressed. In the process of compressing the border, an effective range of EL film formation will also be greatly compressed, which will cause layers of the EL or shadow to cover the retaining wall (Dam) at the edge of the panel, thereby shortening an intrusion path of water vapor and greatly reducing the product's reliability, thus impacting the service life of the product.

SUMMARY OF INVENTION

Embodiments of the present application provide a display panel and a method of manufacturing the display panel, which can prevent the intrusion of water vapor from the light-emitting layer and improve the reliability of the display panel.

An embodiment of the present application provides a display panel, including a display area and a non-display area surrounding the display area, and the display panel includes:
- a substrate;
- an inorganic structure layer disposed on a side of the substrate, wherein a groove is defined in the non-display area;
- a retaining wall structure disposed on a side of the inorganic structure layer away from the substrate, wherein at least one side of the retaining wall structure covers a part of an opening of the groove;
- a light-emitting layer disposed on a side of the inorganic structure layer away from the substrate, and covering the retaining wall structure in the non-display area and disconnected at the groove; and
- an encapsulation layer disposed on a side of the light-emitting layer away from the substrate, and covering the retaining wall structure and the groove in the non-display area.

Optionally, in some embodiments of the present application, the display panel further includes:
- a driving circuit layer disposed between the substrate and the light-emitting layer, wherein the driving circuit layer includes: the inorganic structure layer, a transistor structure disposed in the inorganic structure layer, and an organic structure layer disposed on a side of inorganic structure layer away from the substrate; and
- wherein the retaining wall structure includes a same organic material as the organic structure layer.

Optionally, in some embodiments of the present application, the driving circuit layer includes:
- a buffer layer disposed on a side of the substrate;
- a semiconductor layer disposed on a side of the buffer layer away from the substrate;
- a gate insulating layer disposed on a side of the semiconductor layer away from the substrate;
- a gate layer disposed on a side of the gate insulating layer away from the substrate;
- a first insulating layer disposed on a side of the gate layer away from the substrate;
- a metal layer disposed on a side of the first insulating layer away from the substrate;
- a second insulating layer disposed on aside of the metal layer away from the substrate;
- a source-drain layer disposed on a side of the second insulating layer away from the substrate;
- a planarization layer disposed on a side of the source-drain layer away from the substrate; and
- a pixel definition layer disposed on a side of the planarization layer away from the substrate;
- wherein the inorganic structure layer includes the buffer layer, the gate insulating layer, the first insulating layer, and the second insulating layer, and the groove at least penetrates the second insulating layer; and
- wherein the organic structure layer includes the planarization layer and the pixel definition layer.

Optionally, in some embodiments of the present application, a distance from an edge of a side of the retaining wall structure covering the opening of the groove to an edge of a side of the opening of the groove covered by the retaining wall structure is a first threshold, and the first threshold ranges from 500 nm to 1000 nm;
- a width of a bottom surface of the groove is a second threshold value, and the second threshold value is greater than the first threshold value; and
- a depth of the groove is a third threshold, and the third threshold ranges from 300 nm to 500 nm.

Optionally, in some embodiments of the present application, a depth of the groove is greater than a thickness of the light-emitting layer in the groove.

Optionally, in some embodiments of the present application, the retaining wall structure includes a first retaining wall, and each of opposite sides of the first retaining wall respectively close to the display area and away from the display area covers a part of an opening of one of the groove.

Optionally, in some embodiments of the present application, the retaining wall structure further includes a second retaining wall disposed on a side of the first retaining wall away from the display area, and each of opposite sides of the second retaining wall respectively close to the first retaining wall and away from the first retaining wall covers a part of the opening of one of the groove.

Optionally, in some embodiments of the present application, two grooves defined between the first retaining wall and the second retaining wall are not communicated with each other.

Optionally, in some embodiments of the present application, the encapsulation layer includes a first inorganic encapsulation layer, an organic encapsulation layer, and a second inorganic encapsulation layer which are stacked in sequence; and each of the first inorganic encapsulation layer and the second inorganic encapsulation layer covers the light-emitting layer and extends to cover the retaining wall structure and the groove, and are continuous in the groove.

Optionally, in some embodiments of the present application, a portion of the encapsulation layer fills the groove.

An embodiment of the present application provides a display device including a display panel, the display panel includes a display area and a non-display area surrounding the display area, and the display panel includes:

- a substrate;
- an inorganic structure layer disposed on a side of the substrate, wherein a groove is defined in the non-display area;
- a retaining wall structure disposed on a side of the inorganic structure layer away from the substrate, wherein at least one side of the retaining wall structure covers a part of an opening of the groove;
- a light-emitting layer disposed on a side of the inorganic structure layer away from the substrate, and covering the retaining wall structure in the non-display area and disconnected at the groove; and
- an encapsulation layer disposed on a side of the light-emitting layer away from the substrate, and covering the retaining wall structure and the groove in the non-display area.

Optionally, in some embodiments of the present application, the display panel further includes:

- a driving circuit layer disposed between the substrate and the light-emitting layer, wherein the driving circuit layer includes: the inorganic structure layer, a transistor structure disposed in the inorganic structure layer, and an organic structure layer disposed on a side of inorganic structure layer away from the substrate; and
- wherein the retaining wall structure includes a same organic material as the organic structure layer.

Optionally, in some embodiments of the present application, the driving circuit layer includes:

- a buffer layer disposed on a side of the substrate;
- a semiconductor layer disposed on a side of the buffer layer away from the substrate;
- a gate insulating layer disposed on a side of the semiconductor layer away from the substrate;
- a gate layer disposed on a side of the gate insulating layer away from the substrate;
- a first insulating layer disposed on a side of the gate layer away from the substrate;
- a metal layer disposed on a side of the first insulating layer away from the substrate;
- a second insulating layer disposed on aside of the metal layer away from the substrate;
- a source-drain layer disposed on a side of the second insulating layer away from the substrate;
- a planarization layer disposed on a side of the source-drain layer away from the substrate; and
- a pixel definition layer disposed on a side of the planarization layer away from the substrate;
- wherein the inorganic structure layer includes the buffer layer, the gate insulating layer, the first insulating layer, and the second insulating layer, and the groove at least penetrates the second insulating layer; and
- wherein the organic structure layer includes the planarization layer and the pixel definition layer.

Optionally, in some embodiments of the present application, a distance from an edge of a side of the retaining wall structure covering the opening of the groove to an edge of a side of the opening of the groove covered by the retaining wall structure is a first threshold, and the first threshold ranges from 500 nm to 1000 nm;

- a width of a bottom surface of the groove is a second threshold value, and the second threshold value is greater than the first threshold value; and
- a depth of the groove is a third threshold, and the third threshold ranges from 300 nm to 500 nm.

Optionally, in some embodiments of the present application, a depth of the groove is greater than a thickness of the light-emitting layer in the groove.

Optionally, in some embodiments of the present application, the retaining wall structure includes a first retaining wall, and each of opposite sides of the first retaining wall respectively close to the display area and away from the display area covers a part of an opening of one of the groove.

Optionally, in some embodiments of the present application, the retaining wall structure further includes a second retaining wall disposed on a side of the first retaining wall away from the display area, and each of opposite sides of the second retaining wall respectively close to the first retaining wall and away from the first retaining wall covers a part of the opening of one of the groove.

Optionally, in some embodiments of the present application, two grooves defined between the first retaining wall and the second retaining wall are not communicated with each other.

Optionally, in some embodiments of the present application, the encapsulation layer includes a first inorganic encapsulation layer, an organic encapsulation layer, and a second inorganic encapsulation layer which are stacked in sequence; and each of the first inorganic encapsulation layer and the second inorganic encapsulation layer covers the light-emitting layer and extends to cover the retaining wall structure and the groove, and are continuous in the groove.

Optionally, in some embodiments of the present application, a portion of the encapsulation layer fills the groove.

The display panel provided by the embodiments of the present application includes a substrate, an inorganic structure layer, a retaining wall structure, and a light-emitting layer. The inorganic structural layer is disposed on the substrate. The inorganic structure layer is provided with a groove. The retaining wall structure is arranged on the inorganic structure layer. The light-emitting layer is arranged on the retaining wall and the inorganic structure layer, wherein at least one side of the retaining wall structure covers a part of an opening of the groove. The light-emitting layer is disconnected at the groove. The display panel is provided with a groove under the retaining wall, and at least one side of the retaining wall structure covers part of the opening of the groove to form an undercut structure. The undercut structure can provide a blocking effect on the light-emitting layer, so that the light-emitting layer is disconnected at the groove during the film formation process. As a result, the intrusion path of water vapor along the light-emitting layer is blocked, the reliability of the display panel is prolonged, and the service life of the product is further improved.

BRIEF DESCRIPTION OF DRAWINGS

In order to more clearly illustrate the technical solutions of the embodiments of the application, the drawings illustrating the embodiments will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
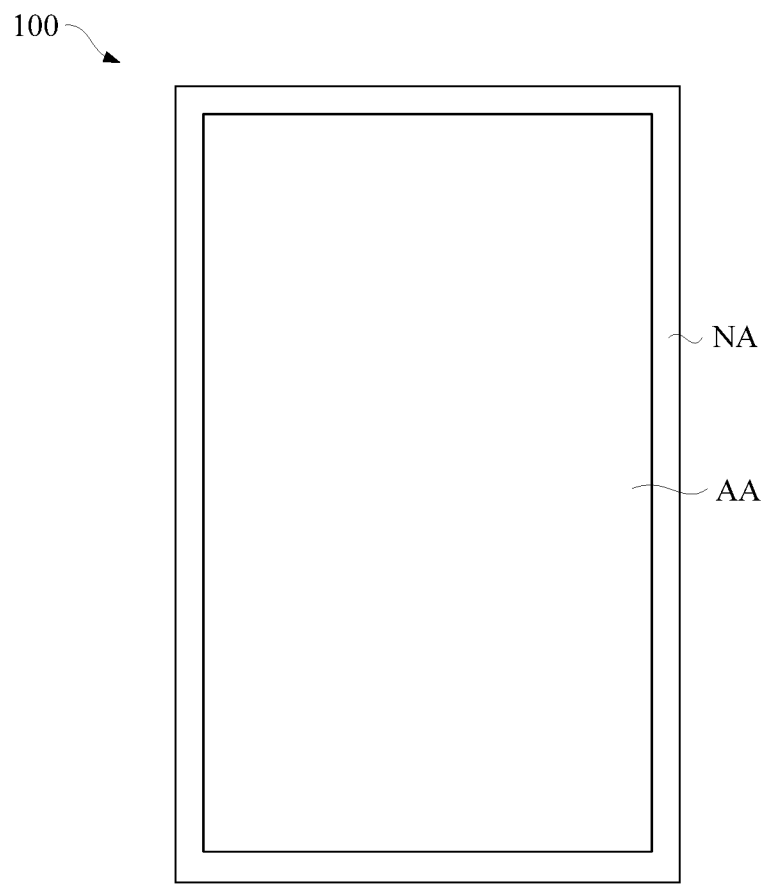
FIG. 1 is a schematic structural diagram of a display panel provided by an embodiment of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application. In addition, it should be understood that the specific implementations described here are only used to illustrate and explain the application, and are not used to limit the application. In the present application, unless otherwise stated, the orientation words used such as "upper" and "lower" generally refer to the upper and lower directions of the device in actual use or working state, and specifically refer to the drawing directions in the drawings, while "inner" and "outer" refer to the outline of the device.

Embodiments of the present application provide an array substrate and a method for manufacturing the array substrate. Each of the embodiment will be described in detail below. It should be noted that the description order of the following embodiments is not intended to limit the preferred order of the embodiments.

Figure 2:
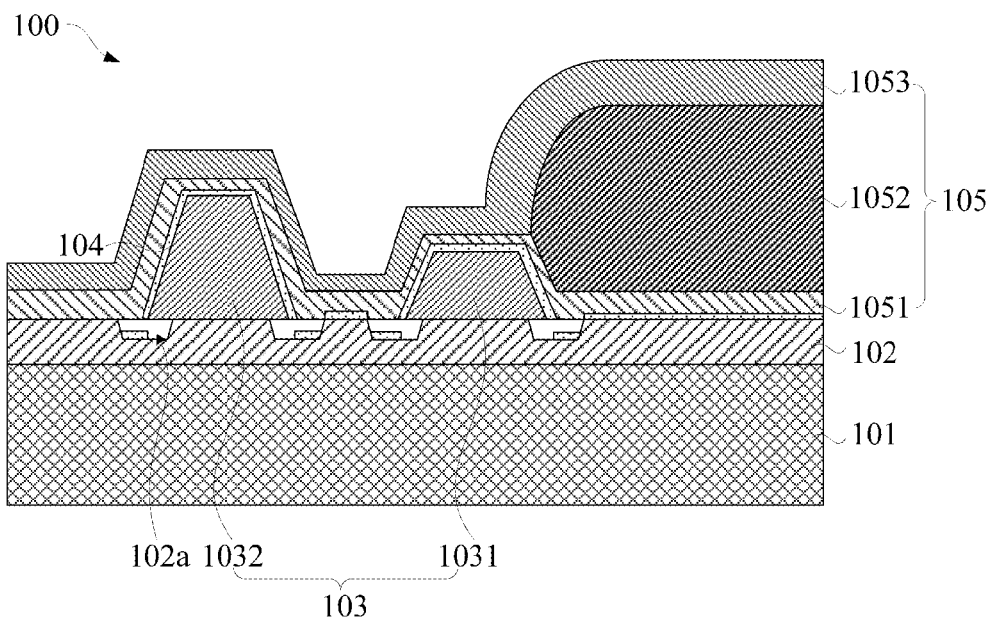
FIG. 2 is a first structural schematic diagram of a non-display area of a display panel provided by an embodiment of the present application.

Referring to FIG. 1 and FIG. 2, FIG. 1 is a schematic structural diagram of a display panel provided by an embodiment of the present application; and FIG. 2 is a schematic structural diagram of a non-display area of a display panel provided by an embodiment of the present application. The display panel 100 provided by the embodiment of the present application includes a display area AA and a non-display area NA surrounding the display area AA. The display panel 100 includes a substrate 101, an inorganic structure layer 102, a retaining wall structure 103, a light-emitting layer 104 and an encapsulation layer 105. The inorganic structure layer 102 is disposed on one side of the substrate 101, and a groove 102a is disposed in the non-display area NA. The retaining wall structure 103 is disposed on the side of the inorganic structure layer 102 away from the substrate 101, and at least one side of the retaining wall structure 103 covers part of the opening of the groove 102 a. The light-emitting layer 104 is disposed on a side of the inorganic structure layer 103 away from the substrate 101, and covers the retaining wall structure 103 in the non-display area NA and is disconnected at the groove 102a. The encapsulation layer 105 is disposed on the side of the light-emitting layer 104 away from the substrate 101, and covers the retaining wall structure 103 and the groove 102a in the non-display area NA.

The display panel provided by the embodiment of the present application includes a substrate 101, an inorganic structure layer 102, a retaining wall structure 103, a light-emitting layer 104, and an encapsulation layer 105. In order to prevent water vapor from intruding the flexible OLED display, a thin-film encapsulation structure is usually fabricated on the flexible OLED display. In order to prevent the overflow of organic materials in the thin-film encapsulation structure, a retaining wall is made at a border area of the display screen. The border area of some narrow-bezel displays is small, and a film formation area of the light-emitting material is also compressed, which will cause the light-emitting material to cover the retaining wall during film formation, thereby shortening the intrusion path of water vapor and reducing the reliability of the display screen. The display panel 100 provided by the embodiment of the present application is provided with a groove 102a on the inorganic structure layer 102. In addition, at least one side of the retaining wall structure 103 covers a part of the opening of the groove 102a. That is, an undercut structure is formed under the retaining wall structure 103. Such an undercut structure can provide a blocking effect on the light-emitting layer 104, so that the light-emitting layer 104 is disconnected at the retaining wall structure 103 and the groove 102a during the film formation process. As a result, the intrusion path of water vapor along the light-emitting layer 104 is blocked, the reliability of the display panel 100 is increased, and the service life of the product is further prolonged. In addition, using the encapsulation layer 105 to encapsulate the light-emitting layer 104 and the device structure in the display panel 100 can prevent the intrusion of water vapor from the light-emitting layer 104, and at the same time, the display panel 100 can be well encapsulated, and the intrusion of water vapor can be better blocked.

Moreover, since the groove 102a is provided under the retaining wall structure 103, the retaining wall structure 103 covers part of the opening of the groove 102a. During the process, the effective area of vapor deposition of the light-emitting layer 104 can be broadened. In the display panel 100 with a narrow border, the problem of water and oxygen intrusion caused by the light-emitting layer 104 covering the retaining wall structure 103 can be more effectively solved. Thus, the border of the display panel 100 can be effectively narrowed.

Figure 3:
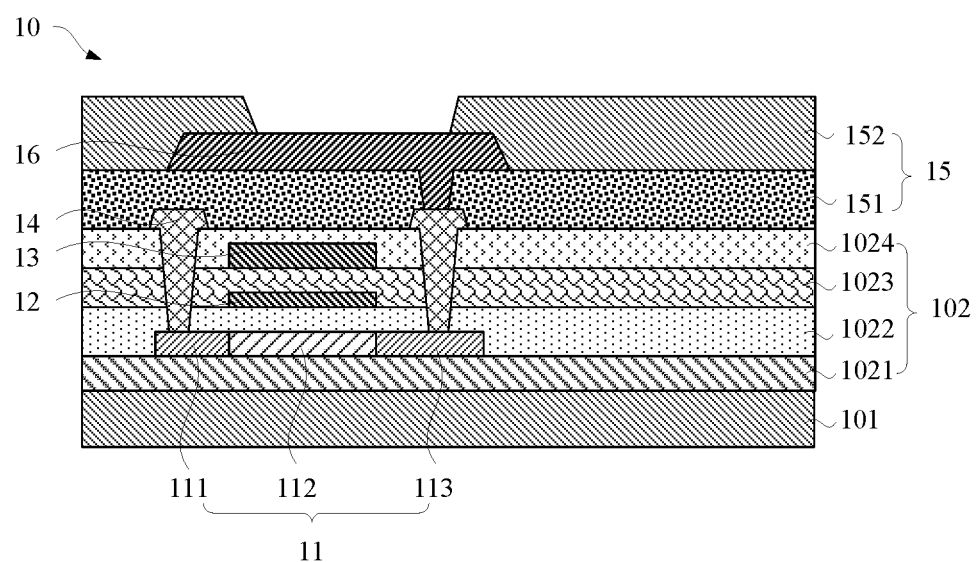
FIG. 3 is a schematic structural diagram of a display area of a display panel provided by an embodiment of the present application.

Optionally, referring to FIG. 2 and FIG. 3. FIG. 3 is a schematic structural diagram of a display area of a display panel provided by an embodiment of the present application. The display panel 100 further includes a driving circuit layer 10 disposed between the substrate 101 and the light-emitting layer 104. The driving circuit layer 10 includes an inorganic structure layer, a transistor structure 6 provided in the inorganic structure layer, and an organic structure layer provided on the side of the inorganic structure layer away from the substrate. The retaining wall structure includes the same organic material as the organic structure layer.

It should be noted that the etching rates of the same etchant for the organic layer and the inorganic layer are different, and the etching rates for different inorganic layers are also different. Therefore, the retaining wall structure is made of an organic material, and then the inorganic structure layer is etched by an etching method, so that an undercut structure can be easily fabricated under the retaining wall structure. Optionally, the etchant may be hydrofluoric acid (HF).

Optionally, the driving circuit layer 10 includes a buffer layer 1021, a semiconductor layer 11, a gate insulating layer 1022, a gate layer 12, a first insulating layer 1023, a metal layer 13, a second insulating layer 1024, a source-drain layer 14, a planarization layer 151, a pixel electrode layer 16, and a pixel definition layer 152. The buffer layer 1021 is provided on one side of the substrate 101. The semiconductor layer 11 is disposed on the side of the buffer layer 1021 away from the substrate 101. The gate insulating layer 1022 is disposed on the side of the semiconductor layer 11 away from the substrate 101. The gate layer 12 is disposed on the side of the gate insulating layer 1022 away from the substrate 101. The first insulating layer 1023 is disposed on the side of the gate layer 12 away from the substrate 101. The metal layer 13 is disposed on the side of the first insulating layer 1023 away from the substrate 101. The second insulating layer 1024 is disposed on the side of the metal layer 15 away from the substrate 101. The source-drain layers 14 are disposed on the side of the second insulating layer 1024 away from the substrate 101. The planarization layer 151 is disposed on the side of the source-drain layers 14 away from the substrate 101. The pixel definition layer 152 is disposed on the side of the planarization layer 151 away from the substrate 101. The pixel electrode layer 16 is disposed on the planarization layer 151 and is connected to the source-drain layer 14 through a via hole. The light-emitting layer is disposed on the side of the pixel electrode layer 16 away from the substrate 101.

The inorganic structural layer 102 includes a buffer layer 1021, a gate insulating layer 1022, a first insulating layer 1023 and a second insulating layer 1024. The groove 102a penetrates at least the second insulating layer 1024. The organic structure layer 15 includes a planarization layer 151 and a pixel definition layer 152. The semiconductor layer 11 includes a source region 111, an active region 112 and a drain region 113.

It should be noted that the specific structure of the driving circuit layer 10 is a technology well known to those skilled in the art, and thus will not be repeated in this application for brevity. In addition, the above-mentioned driving circuit layer 10 is described by taking the double-gate thin film transistor as an example, but the type of the thin film transistor is not particularly limited in the embodiments of the present application, which can be a top-gate thin film transistor or a bottom-gate thin film transistor, or can also be a double-gate thin film transistor, or a single-gate thin film transistor.

The groove 102a penetrates through at least the second insulating layer 1024. Optionally, the groove 102a may continue to extend downward. For example, the groove 102a penetrates through portions of the second insulating layer 1024 and the first insulating layer 1023. Alternatively, the groove 102a penetrates through the second insulating layer 1024 and the first insulating layer 1023. Alternatively, the groove 102a penetrates through the second insulating layer 1024, the first insulating layer 1023, and the gate insulating layer 1022. The depth of the groove 102a penetrating the inorganic structure layer 102 is not particularly limited in the embodiments of the present application.

Specifically, at least one layer of the inorganic structure layer 102 has a single-layered structure. The depth of the grooves 102a is smaller than the thickness of the inorganic structure layer 102. That is, when the inorganic structural layer 102 is a single layer, the grooves 102a are not etched through the inorganic structural layer 102 by controlling the amount of the etchant to match the thickness of the inorganic structural layer 102.

Alternatively, at least one of the inorganic structural layers 102 is a stack of multiple sub-layers. For example, the second insulating layer 1024 is a layer composed of the multiple sub-layers. The groove 102a penetrates at least one sub-layer on the side of the second insulating layer 1024 away from the substrate 101. For example, the second insulating layer 1024 includes a titanium oxide layer, a silicon oxide layer, and an aluminum oxide layer sequentially stacked in a direction away from the substrate 101, and the aluminum oxide layer is etched by using a specific etchant of aluminum oxide. Because the etching rate of silicon oxide by the specific etchant for aluminum oxide is lower than the etching rate of aluminum oxide by the specific etchant for aluminum oxide, the etchant continues to laterally etch the aluminum oxide layer, but cannot etch through the silicon oxide layer. Therefore, an undercut structure is formed on the inorganic structure layer 102.

It is appreciated that the sub-layers in the inorganic structural layer 102 may also be layers formed in other sequences or of other materials. The above-mentioned inorganic structure layer 102 including a titanium oxide layer, a silicon oxide layer, and an aluminum oxide layer that are sequentially stacked in a direction away from the substrate is only an example, and is not intended to limit the present application. In addition, it is also an example that the groove 102a penetrates through the aluminum oxide layer, and the groove 102a may also penetrate through the aluminum oxide layer and the silicon oxide layer, and so on.

Optional, still referring to FIG. 2, the retaining wall structure 103 includes a first retaining wall 1031. Each of opposite sides of the first retaining wall 1031 respectively close to the display area AA and away from the display area AA covers a part of an opening of one of the grooves 102a. Optionally, the retaining wall structure 103 further includes a second retaining wall 1032 disposed on the side of the first retaining wall 1031 away from the display area AA. Opposite sides of the second retaining wall 1032 close to the first retaining wall 1031 and away from the first retaining wall 1031 cover a part of the opening of the groove 102a. Optionally, two grooves 102a defined between the first retaining wall 1031 and the second retaining wall 1032 are not communicated with each other.

The above design can ensure that the light-emitting layer 104 is more fully disconnected at the undercut structure formed by the retaining wall structure 103 and the groove 102a, and more effectively prevents water vapor from intruding the display panel 100 along the light-emitting layer 104.

Optional, still referring to FIG. 2, the encapsulation layer 105 includes a first inorganic encapsulation layer 1051, an organic encapsulation layer 1052, and a second inorganic encapsulation layer 1053 that are stacked in sequence. The first inorganic encapsulation layer 1051 and the second inorganic encapsulation layer 1053 both cover the light-emitting layer 104 and extend to cover the retaining wall structure 103 and the groove 102a, and continuously extend and are not disconnected in the groove 102a.

The material used for each of the first inorganic encapsulation layer 1051 and the second inorganic encapsulation layer 1053 is one or a combination of aluminum oxide, titanium oxide, silicon oxide, silicon nitride, silicon oxynitride and silicon carbonitride. The material used for the organic encapsulation layer 1052 is one or a combination of acrylamide, polyacrylate, polycarbonate, polystyrene, and hexamethyldisiloxane. In the encapsulation layer 105, a combination of an inorganic material and an organic material is used for encapsulation, so that a better encapsulation effect can be obtained. The first inorganic encapsulation layer 1051 and the second inorganic encapsulation layer 1053 are used to block water and oxygen. In addition, by utilizing the organic properties of the organic encapsulation layer 1052, the intrusion path of water vapor is prolonged. Meanwhile, the organic encapsulation layer 1052 has good step coverage, and can well cover the layer that needs to be encapsulated. Combining the organic material with the inorganic material can improve the water and oxygen barrier capability of the encapsulation layer, thereby increasing the service life of the display panel 100.

The organic encapsulation layer 1052 is disposed between the first inorganic encapsulation layer 1051 and the second inorganic encapsulation layer 1053, which enables the first inorganic encapsulation layer 1051 and the second inorganic encapsulation layer 1053 to play a role similar to a retaining wall. After the organic encapsulation layer 1052 absorbs water and oxygen, the first inorganic encapsulation layer 1051 and the second inorganic encapsulation layer 1053 can block the water and oxygen in the organic encapsulation layer 1052, so that he first inorganic encapsulation layer 1051 and the second inorganic encapsulation layer 1053 form a barrier space that traps the water and oxygen, thereby preventing the water and oxygen from diffusing and intruding. Such an encapsulation layer 105 further improves the barrier performance against water and oxygen and encapsulation reliability.

It should be noted that the encapsulation layer 105 may also be an inorganic/organic/inorganic/organic/inorganic five-layer sandwich structure, or other structures. The encapsulation layer 105 can be adaptively designed according to the size and thinness requirements of the display panel 100.

The thickness of the light-emitting layer 104 is smaller than the depth of the groove 102a, and the thickness of the encapsulation layer 105 is larger than the depth of the groove 102a. Therefore, the light-emitting layer 104 can be disconnected at an undercut space 102b, and the encapsulation layer 105 can be a continuous layer at the undercut space 102b.

The encapsulation layer 105 covers another part of the opening of the groove 102a. During the manufacturing process, by controlling the manufacturing process of the encapsulation layer 105, the encapsulation layer 105 can be prevented from entering the groove 102a, so that the encapsulation layer 105 can be suspended at the groove 102a. Such a structure can reduce a step difference of the encapsulation layer 105 at opposite sides of the retaining wall structure 103, thereby preventing the encapsulation layer 105 from breaking, thus ensuring the encapsulation effect of the encapsulation layer 105, and further enhancing the reliability of the display panel 100.

Figure 4:
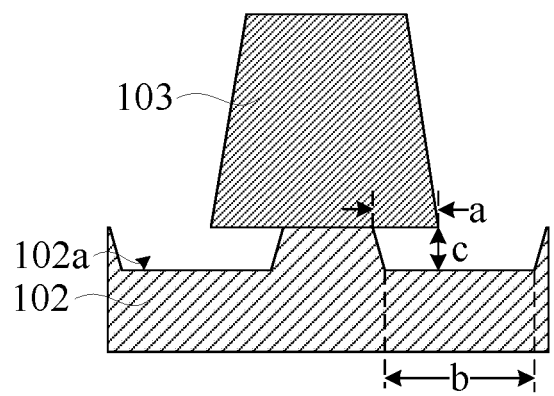
FIG. 4 is a schematic diagram of a partial structure of a display panel provided by an embodiment of the present application.

Optionally, referring to FIG. 4, FIG. 4 is a schematic diagram of a partial structure of a display panel provided by an embodiment of the present application. A distance from an edge of a side of the retaining wall structure 103 covering the opening of the groove 102a to an edge of a side of the opening of the groove 102a covered by the retaining wall structure 103 is a first thresholds, and the first threshold ranges from 500 nm to 1000 nm. A width of a bottom surface of the groove 102a is a second threshold value b, and the second threshold value b is greater than the first threshold value a. A depth of the groove 102a is a third threshold value c, and the third threshold c ranges from 300 nm to 500 nm.

Specifically, the first threshold a may be 500 nm, 550 nm, 600 nm, 650 nm, 700 nm, 750 nm, 800 nm, 850 nm, 900 nm, 950 nm, or 1000 nm, and the third threshold c may be 300 nm, 310 nm, 320 nm, 330 nm, 340 nm, 350 nm, 400 nm, 450 nm, 460 nm, 470 nm, 480 nm, 490 nm, or 500 nm.

It should be understood that the description in a range format is merely for convenience and brevity and should not be construed as an inflexible limitation on the scope of the invention. Accordingly, the stated range description should be considered to have specifically disclosed all possible subranges as well as individual numerical values within that range. For example, a description of a range between 300 nanometers and 500 nanometers should be considered to have specifically disclosed subranges, such as from 300 nanometers to 347 nanometers, from 415 nanometers to 488 nanometers, etc., as well as single numerals in the range, such as 300, 301, 302 and 303, etc., and this applies regardless of the range. Additionally, whenever a numerical range is indicated herein, it is meant to include any cited number (fractional or integer) within the indicated range.

Because the light-emitting layer 104 in the display panel provided by an embodiment of the present application needs to be disconnected at the groove 102a under the retaining wall structure 103, while ensuring the encapsulation layer 105 to be a continuous layer, the inventors of the present application have found through experiments that when the range satisfying: the first threshold a ranging from 500 nm to 1000 nm, the width of the bottom surface of the groove 102a being the second threshold b, the second threshold b being greater than the first threshold a, and the third threshold c ranging from 300 nm to 500 nm, a structure in which the light-emitting layer 104 is disconnected at the groove 102a, while the encapsulation layer 105 is not disconnected at the groove can be fabricated. Thus, intrusion path of the water and oxygen from the light-emitting layer 104 is blocked, and the encapsulation effect of the encapsulation layer 105 is ensured.

Optionally, the depth c of the groove 102a is greater than the thickness of the light-emitting layer 104 in the groove 102a. This can better ensure that the light-emitting layer 104 is disconnected at the groove 102a.

Figure 5:
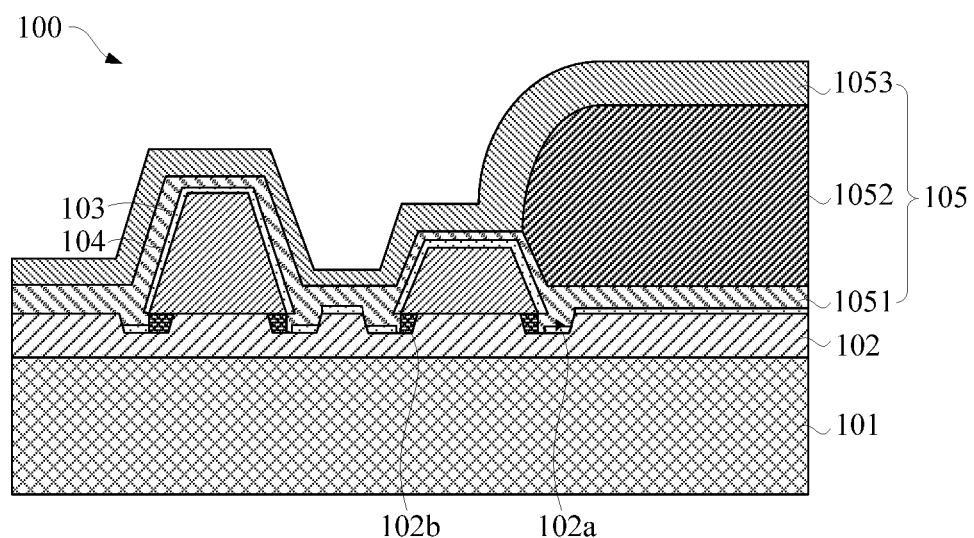
FIG. 5 is a second structural schematic diagram of a non-display area of a display panel provided by an embodiment of the present application.

Optionally, referring to FIG. 5, FIG. 5 is a second structural schematic diagram of a non-display area of a display panel provided by an embodiment of the present application. The display panel 100 further includes a filling material layer 102b. The filling material layer 102b fills at least part of the groove 102a.

It is appreciated that, in FIG. 5, the filling material layer 102d partially filling the groove 102a is taken as an example for illustration, and the filling material layer 102b may also fully fill the groove 102a. A specific height of the filling material layer 102b can be adaptively adjusted according to the depth of the groove 102a and the thickness of the encapsulation layer 105.

The filling material layer 102b can be filled in the groove 102a by coating. For example, in a specific embodiment, a liquid glue is filled into the groove 102a, and then irradiated with ultraviolet light to cure the liquid glue, thereby forming the filling material layer 102b.

By arranging the filling material layer 102b in the groove 102a, it can play a role of padding, which makes it difficult for the encapsulation layer 105 to fall into the groove 102a to produce a large step difference during deposition, thereby preventing the encapsulation layer 105 from breaking at the groove 102a. Moreover, the filling material layer 102b can be made of a material with better water blocking effect, to further block the water vapor from the light-emitting layer 104 at the groove 102a. In addition, the filling material layer 102d can also stabilize the retaining wall structure 103, and the structural stability of the retaining wall 103 is ensured while the groove 102a is formed.

Figure 6:
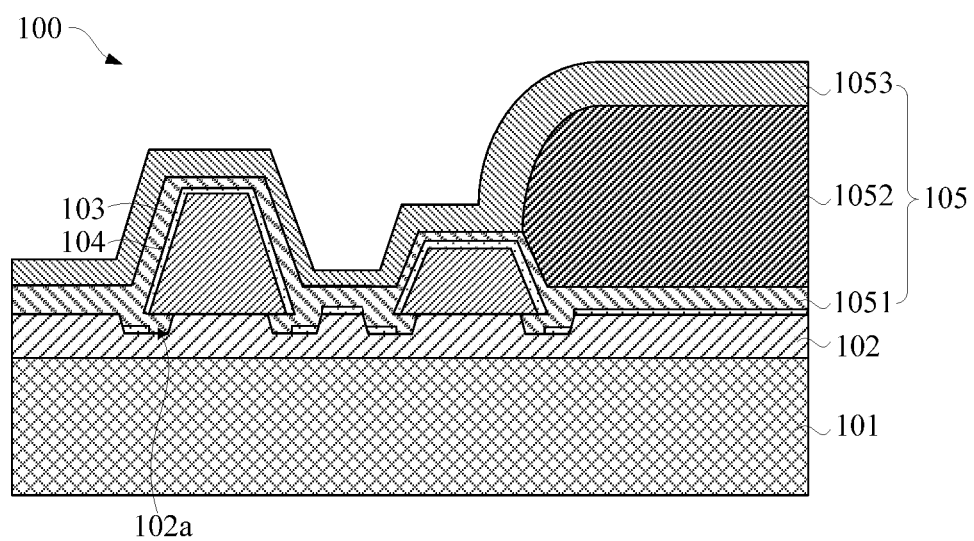
FIG. 6 is a third structural schematic diagram of a non-display area of a display panel provided by an embodiment of the present application.

Optionally, referring to FIG. 6, which is a third structural schematic diagram of a non-display area in a display panel provided by an embodiment of the present application, part of the encapsulation layer 105 fills the groove 102a.

Part of the encapsulation layer 105 fills the groove 102a, so that, on the one hand, the water and oxygen barrier effect in the groove 102a can be enhanced, the encapsulation layer 105 is filled at the disconnected position of the light-emitting layer 104, which can better block the intrusion of water and oxygen, improve the reliability of the display panel 100, and further increase the service life of the display panel 100; and on the other hand, the encapsulation layer 105 is filled in the groove 102a to provide a stabilization effect on the retaining wall structure 103, and prevents the retaining wall structure 103 from tilting toward the groove 102a when being squeezed by the encapsulation layer 105, which would otherwise impact the encapsulation reliability of the display panel 100.

Optionally, the first inorganic encapsulation layer 1051 fills the groove 102a. Because the thickness of the first inorganic encapsulation layer 1051 in the encapsulation layer 105 is generally greater than the depth of the groove 102a. Therefore, the first inorganic encapsulation layer 1051 can be used to directly fill the groove 102a.

Figure 7:
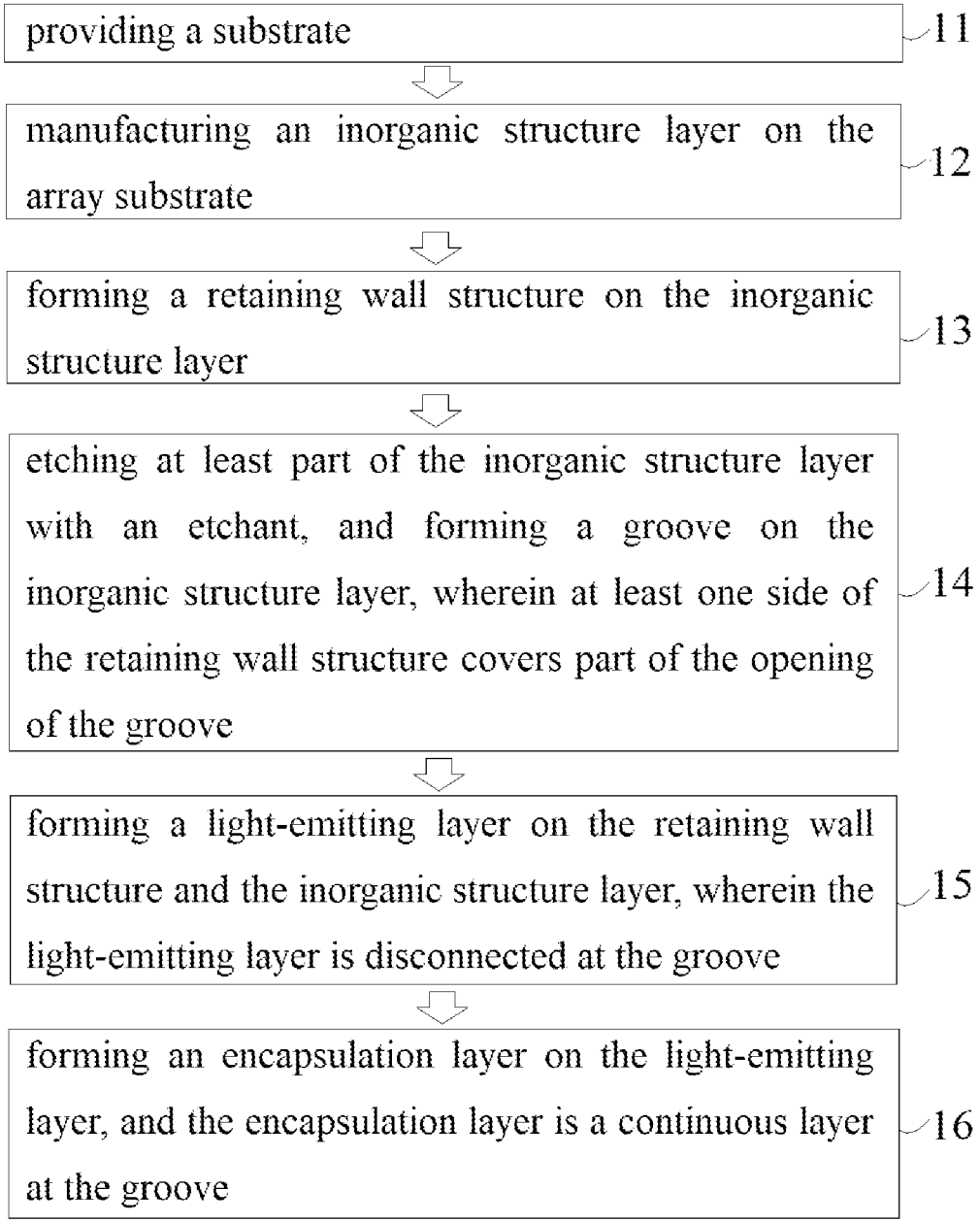
FIG. 7 is a schematic flowchart of a method of manufacturing a display panel provided by an embodiment of the present application.

Correspondingly, the embodiments of the present application also provide a method of manufacturing a display panel. Specifically, referring to FIG. 7 to FIG. 8e, FIG. 7 is a schematic flowchart of a method of manufacturing a display panel provided by an embodiment of the present application, FIG. 8a to FIG. 8e are schematic diagrams of steps of a method of manufacturing a display panel provided by an embodiment of the present application. The method of manufacturing a display panel provided by the embodiment of the present application specifically includes the following steps:

Step 11, providing a substrate.

Step 12, manufacturing an inorganic structure layer on the array substrate.

Figure 8A:
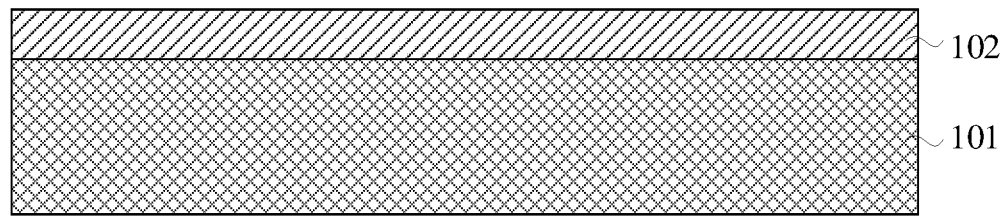
FIG. 8a to FIG. 8e are schematic diagrams of steps of a method of manufacturing a display panel provided by an embodiment of the present application.

Specifically, referring to FIG. 8a, the inorganic structure layer 102 may be deposited on the substrate 101 by plasma chemical vapor deposition (PECVD), atomic force deposition (ALD), pulsed laser deposition (PLD), or sputtering. The materials used for the inorganic thin film of the inorganic structure layer 102 include, but are not limited to, an inorganic functional material such as aluminum oxide, titanium oxide, silicon oxide, silicon nitride, and silicon carbonitride, which are used to increase the water blocking effect. The inorganic structure layer 102 can be a single-layered or multi-layered structure, whose at least one layer can be etched by a specific etchant.

Step 13, forming a retaining wall structure on the inorganic structure layer.

Figure 8B:
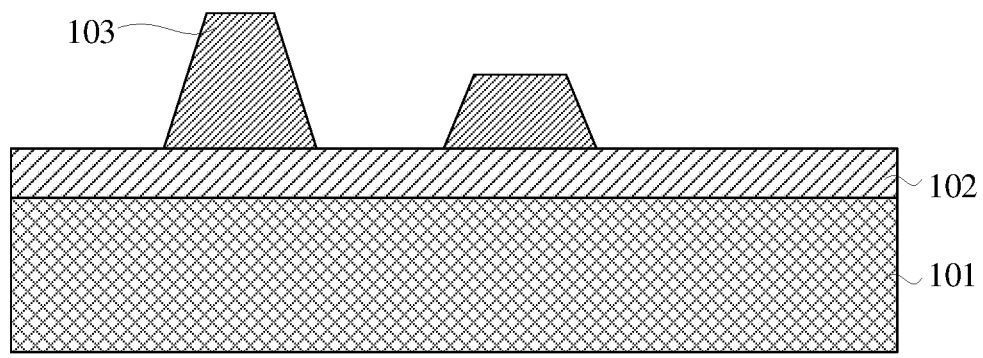

Specifically, referring to FIG. 8b, the method of manufacturing the retaining wall structure 103 is a technical means commonly used by those skilled in the art, and will not be repeated herein for brevity.

Step 14, etching at least part of the inorganic structure layer with an etchant, and forming a groove on the inorganic structure layer, wherein at least one side of the retaining wall structure covers part of the opening of the groove.

Figure 8C:
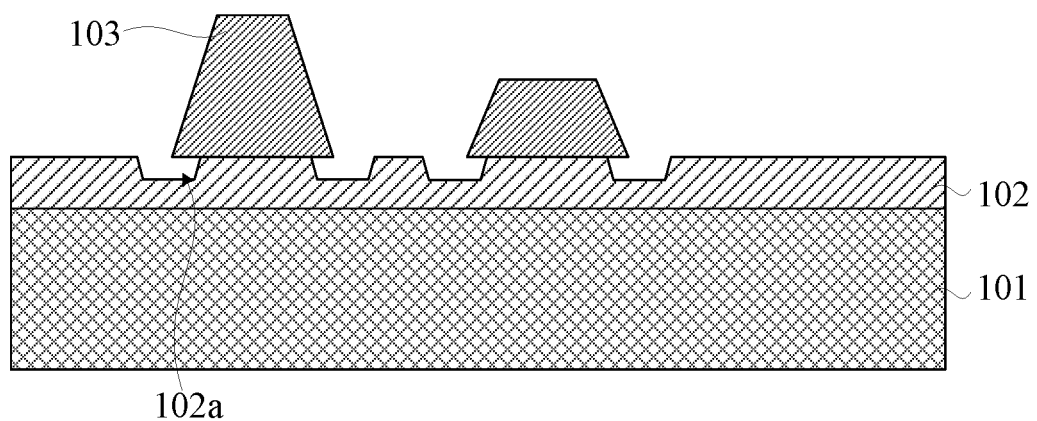

Specifically, referring to FIG. 8c, under the retaining wall structure 103 in the border area of the display panel 100, the inorganic structure layer 102 is etched by methods such as exposure, development, etching, etc. to form a groove 102a. At least one side of the retaining wall structure 103 covers part of the opening of the groove 102a, so that the groove 102a and the side of the retaining wall structure 103 close to the substrate 101 form an undercut structure. In addition, a distance from an edge of a side of the retaining wall structure 103 covering the opening of the groove 102a to an edge of a side of the opening of the groove 102a covered by the retaining wall structure 103 is a first thresholds, and the first threshold ranges from 500 nm to 1000 nm. A width of a bottom surface of the groove 102a is a second threshold value b, and the second threshold value b is greater than the first threshold value a. A depth of the groove 102a is a third threshold value c, and the third threshold c ranges from 300 nm to 500 nm. The light-emitting layer 104 deposited at the groove 102a will be disconnected, but the encapsulation layer 105 produced subsequently will not be disconnected.

Step 15, forming a light-emitting layer on the retaining wall structure and the inorganic structure layer, wherein the light-emitting layer is disconnected at the groove.

Figure 8D:
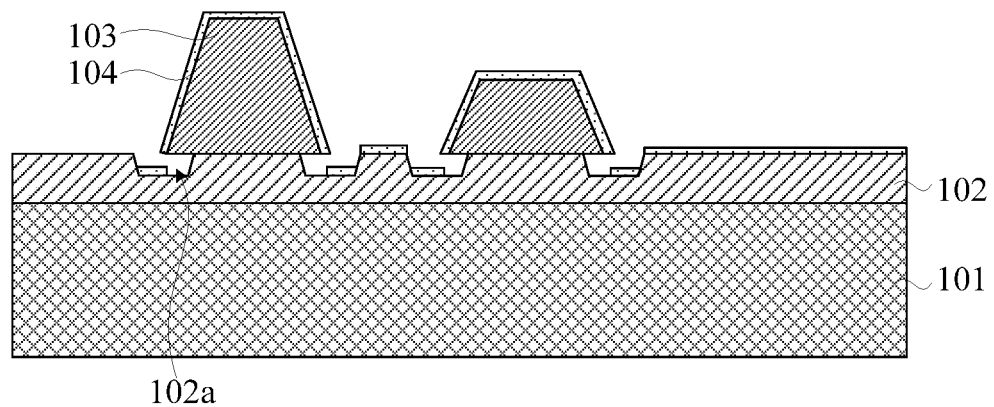
Figure 8E:
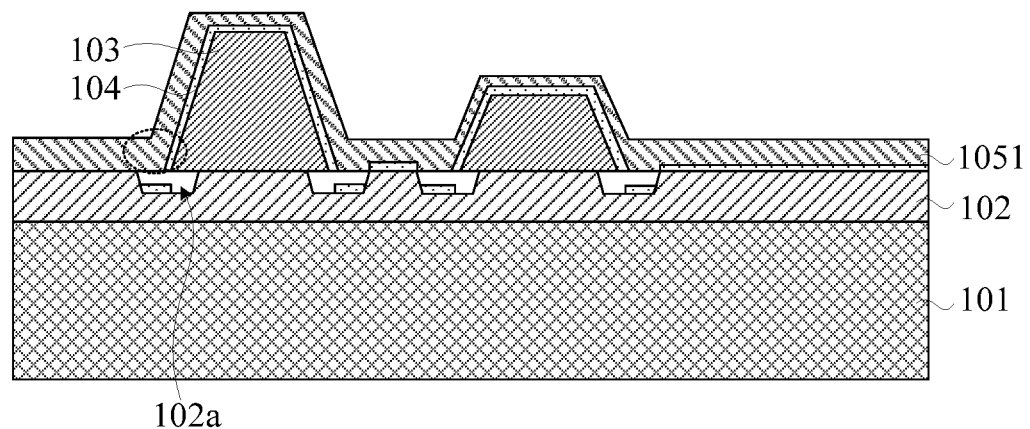

Specifically, referring to FIG. 8d, the light-emitting layer 104 is evaporated on the array substrate 101 through a light-emitting layer mask. The light-emitting layer 104 will be disconnected at the retaining wall 103 due to the action of the groove 102a, forming a discontinuous light-emitting layer 104 to block the intrusion path of water vapor.

Step 16, forming an encapsulation layer on the light-emitting layer, and the encapsulation layer is a continuous layer at the groove.

Optionally, the step of manufacturing the encapsulation layer on the light-emitting layer specifically includes the following steps:

Step 161, forming a first inorganic encapsulation layer on the light-emitting layer.

Specifically, referring to FIG. 8e, the first inorganic encapsulation layer 1051 is deposited on the light-emitting layer 104 by plasma chemical vapor deposition, atomic force deposition, pulsed laser deposition, or sputtering. The material used for the first inorganic encapsulation layer 1051 includes, but is not limited to, an inorganic functional material such as aluminum oxide, titanium oxide, silicon oxide, silicon nitride, and silicon carbonitride, which is used to increase the water blocking effect.

Step 162, forming an organic encapsulation layer on the first inorganic encapsulation layer.

Specifically, ink-jet printing (IJP), PECVD, or slot coating is used for organic materials, and the organic materials are patterned by lithography to deposit one organic encapsulation layer on the first inorganic encapsulation layer. The material used in the organic encapsulation layer includes, but is not limited to, acrylamide, polyacrylate, polycarbonate, polystyrene, and hexamethyldisiloxane. The organic encapsulation layer can not only prolong the intrusion path of water vapor, but also can be used to buffer the stress of the device when the device is bent and folded, and the organic encapsulation layer can also cover the particle contamination to prevent poor display.

Step 163, forming a second inorganic encapsulation layer on the organic encapsulation layer.

Optionally, the method of manufacturing the second inorganic encapsulation layer on the organic encapsulation layer is the same as the method of manufacturing the first inorganic encapsulation layer, and details are not repeated herein for brevity. After the second inorganic encapsulation layer is fabricated, the display panel 100 shown in FIG. 2 is obtained. It should be noted that step 17 and step 18 may be alternately performed multiple times to obtain an encapsulation structure composed of alternating organic thin films and inorganic thin films.

The method of manufacturing a display panel provided by an embodiment of the present application is used to fabricate a display panel. The display panel provided by the embodiments of the present application includes a substrate, an inorganic structure layer, a retaining wall structure, and a light-emitting layer. The inorganic structural layer is disposed on the substrate. The inorganic structure layer is provided with a groove. The retaining wall structure is arranged on the inorganic structure layer. The light-emitting layer is arranged on the retaining wall and the inorganic structure layer, wherein different materials in the inorganic structure layer are etched at different rates by using the etchant, and the undercut structure can be formed by etching under the retaining wall. The undercut structure can provide a blocking effect on the light-emitting layer, so that the light-emitting layer is disconnected at the groove during the film formation process. As a result, the path of the intrusion of water vapor along the light-emitting layer is blocked, the reliability of the display panel is prolonged, and the service life of the product is further improved.

In addition, since the undercut structure is arranged under the retaining wall, the effective area of vapor deposition of the light-emitting layer can be broadened during the manufacturing process. For a display panel with a narrow border, the problem of water and oxygen intrusion caused by the light-emitting layer covering the retaining wall can be more effectively solved. Therefore, the border of the display panel can be effectively narrowed.

A display panel and a method of manufacturing a display panel provided by the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising a display area and a non-display area surrounding the display area, wherein the display panel further comprises:
    a substrate;
    an inorganic structure layer disposed on a side of the substrate, wherein a groove is defined in the non-display area;
    a retaining wall structure disposed on a side of the inorganic structure layer away from the substrate, wherein at least one side of the retaining wall structure covers a part of an opening of the groove;
    a light-emitting layer disposed on a side of the inorganic structure layer away from the substrate, and covering the retaining wall structure in the non-display area and disconnected at the groove; and
    an encapsulation layer disposed on a side of the light-emitting layer away from the substrate, and covering the retaining wall structure and the groove in the non-display area.

2. The display panel according to claim 1, wherein the display panel further comprises:
    a driving circuit layer disposed between the substrate and the light-emitting layer, wherein the driving circuit layer comprises: the inorganic structure layer, a transistor structure disposed in the inorganic structure layer, and an organic structure layer disposed on a side of inorganic structure layer away from the substrate; and
    wherein the retaining wall structure comprises a same organic material as the organic structure layer.

3. The display panel according to claim 2, wherein the driving circuit layer comprises:
    a buffer layer disposed on a side of the substrate;
    a semiconductor layer disposed on a side of the buffer layer away from the substrate;
    a gate insulating layer disposed on a side of the semiconductor layer away from the substrate;
    a gate layer disposed on a side of the gate insulating layer away from the substrate;
    a first insulating layer disposed on a side of the gate layer away from the substrate;
    a metal layer disposed on a side of the first insulating layer away from the substrate;
    a second insulating layer disposed on aside of the metal layer away from the substrate;
    a source-drain layer disposed on a side of the second insulating layer away from the substrate;
    a planarization layer disposed on a side of the source-drain layer away from the substrate; and
    a pixel definition layer disposed on a side of the planarization layer away from the substrate;
    wherein the inorganic structure layer comprises the buffer layer, the gate insulating layer, the first insulating layer, and the second insulating layer, and the groove at least penetrates the second insulating layer; and
    wherein the organic structure layer comprises the planarization layer and the pixel definition layer.

4. The display panel according to claim 3, wherein a distance from an edge of a side of the retaining wall structure covering the opening of the groove to an edge of a side of the opening of the groove covered by the retaining wall structure is a first threshold, and the first threshold ranges from 500 nm to 1000 nm;
    a width of a bottom surface of the groove is a second threshold value, and the second threshold value is greater than the first threshold value; and
    a depth of the groove is a third threshold, and the third threshold ranges from 300 nm to 500 nm.

5. The display panel according to claim 3, wherein a depth of the groove is greater than a thickness of the light-emitting layer in the groove.

6. The display panel according to claim 1, wherein the retaining wall structure comprises a first retaining wall, and each of opposite sides of the first retaining wall respectively close to the display area and away from the display area covers a part of an opening of one of the groove.

7. The display panel according to claim 6, wherein the retaining wall structure further comprises a second retaining wall disposed on a side of the first retaining wall away from the display area, and each of opposite sides of the second retaining wall respectively close to the first retaining wall and away from the first retaining wall covers a part of the opening of one of the groove.

8. The display panel according to claim 7, wherein two grooves defined between the first retaining wall and the second retaining wall are not communicated with each other.

9. The display panel according to claim 1, wherein the encapsulation layer comprises a first inorganic encapsulation layer, an organic encapsulation layer, and a second inorganic encapsulation layer which are stacked in sequence; and each of the first inorganic encapsulation layer and the second inorganic encapsulation layer covers the light-emitting layer and extends to cover the retaining wall structure and the groove, and are continuous in the groove.

10. The display panel according to claim 1, wherein a portion of the encapsulation layer fills the groove.

11. A display device comprising a display panel, wherein the display panel comprises a display area and a non-display area surrounding the display area, and the display panel further comprises:

a substrate;

an inorganic structure layer disposed on a side of the substrate, wherein a groove is defined in the non-display area;

a retaining wall structure disposed on a side of the inorganic structure layer away from the substrate, wherein at least one side of the retaining wall structure covers a part of an opening of the groove;

a light-emitting layer disposed on a side of the inorganic structure layer away from the substrate, and covering the retaining wall structure in the non-display area and disconnected at the groove; and an encapsulation layer disposed on a side of the light-emitting layer away from the substrate, and covering the retaining wall structure and the groove in the non-display area.

12. The display device according to claim 11, wherein the display panel further comprises:

a driving circuit layer disposed between the substrate and the light-emitting layer, wherein the driving circuit layer comprises: the inorganic structure layer, a transistor structure disposed in the inorganic structure layer, and an organic structure layer disposed on a side of inorganic structure layer away from the substrate; and wherein the retaining wall structure comprises a same organic material as the organic structure layer.

13. The display device according to claim 12, wherein the driving circuit layer comprises:

a buffer layer disposed on a side of the substrate;

a semiconductor layer disposed on a side of the buffer layer away from the substrate;

a gate insulating layer disposed on a side of the semiconductor layer away from the substrate;

a gate layer disposed on a side of the gate insulating layer away from the substrate;

a first insulating layer disposed on a side of the gate layer away from the substrate;

a metal layer disposed on a side of the first insulating layer away from the substrate;

a second insulating layer disposed on aside of the metal layer away from the substrate;

a source-drain layer disposed on a side of the second insulating layer away from the substrate;

a planarization layer disposed on a side of the source-drain layer away from the substrate; and a pixel definition layer disposed on a side of the planarization layer away from the substrate;

wherein the inorganic structure layer comprises the buffer layer, the gate insulating layer, the first insulating layer, and the second insulating layer, and the groove at least penetrates the second insulating layer; and wherein the organic structure layer comprises the planarization layer and the pixel definition layer.

14. The display device according to claim 13, wherein a distance from an edge of a side of the retaining wall structure covering the opening of the groove to an edge of a side of the opening of the groove covered by the retaining wall structure is a first threshold, and the first threshold ranges from 500 nm to 1000 nm;

a width of a bottom surface of the groove is a second threshold value, and the second threshold value is greater than the first threshold value; and a depth of the groove is a third threshold, and the third threshold ranges from 300 nm to 500 nm.

15. The display device according to claim 13, wherein a depth of the groove is greater than a thickness of the light-emitting layer in the groove.

16. The display device according to claim 11, wherein the retaining wall structure comprises a first retaining wall, and each of opposite sides of the first retaining wall respectively close to the display area and away from the display area covers a part of an opening of one of the groove.

17. The display device according to claim 16, wherein the retaining wall structure further comprises a second retaining wall disposed on a side of the first retaining wall away from the display area, and each of opposite sides of the second retaining wall respectively close to the first retaining wall and away from the first retaining wall covers a part of the opening of one of the groove.

18. The display device according to claim 17, wherein two grooves defined between the first retaining wall and the second retaining wall are not communicated with each other.

19. The display device according to claim 11, wherein the encapsulation layer comprises a first inorganic encapsulation layer, an organic encapsulation layer, and a second inorganic encapsulation layer which are stacked in sequence; and each of the first inorganic encapsulation layer and the second inorganic encapsulation layer covers the light-emitting layer and extends to cover the retaining wall structure and the groove, and are continuous in the groove.

20. The display device according to claim 11, wherein a portion of the encapsulation layer fills the groove.

* * * * *